United States Patent
Guo et al.

(10) Patent No.: US 8,159,294 B2
(45) Date of Patent: Apr. 17, 2012

(54) MULTI-VOLTAGE HEADPHONE DRIVE CIRCUIT

(75) Inventors: Jwin-Yen Guo, Chupei (TW); Ching-Hsiang Yang, Taoyuan (TW)

(73) Assignee: Richtek Technology Corporaton, Hsin-Chu (TW)

(*) Notice: Subject to any disclaimer, the term of this patent is extended or adjusted under 35 U.S.C. 154(b) by 458 days.

(21) Appl. No.: 12/460,539

(22) Filed: Jul. 21, 2009

(65) Prior Publication Data

US 2009/0279713 A1 Nov. 12, 2009

Related U.S. Application Data

(63) Continuation-in-part of application No. 11/755,894, filed on May 31, 2007, now Pat. No. 7,991,172.

(30) Foreign Application Priority Data

Dec. 4, 2008 (TW) .............................. 97221700 U

(51) Int. Cl.
H03G 3/00 (2006.01)

(52) U.S. Cl. ........ 330/127; 330/134; 330/199; 330/297; 381/74

(58) Field of Classification Search ................. 381/74, 381/120, 323; 330/297, 310, 311, 250, 124 R, 330/125, 127, 134, 199; 365/226; 363/60; 307/110

See application file for complete search history.

(56) References Cited

U.S. PATENT DOCUMENTS
2005/0110574 A1* 5/2005 Richard et al. ................ 330/297

FOREIGN PATENT DOCUMENTS
WO WO 2008/050272 * 5/2008

* cited by examiner

*Primary Examiner* — Vivian Chin
*Assistant Examiner* — Friedrich W Fahnert
(74) *Attorney, Agent, or Firm* — Tung & Associates

(57) ABSTRACT

The present invention discloses a multi-voltage headphone driver circuit comprising: at least one operational amplifier having an output supplied to a headphone speaker, the operational amplifier receiving a first power supply as its high operation voltage; a charge pump receiving a second power supply to generate a negative voltage corresponding to the second power supply in magnitude; and an m-fold circuit multiplying the negative voltage by m and providing the result to the operational amplifier as a low operation voltage thereof, wherein m is a real number.

3 Claims, 4 Drawing Sheets

MULTI-VOLTAGE HEADPHONE DRIVE CIRCUIT

CROSS REFERENCE TO RELATED APPLICATIONS

This application is a continuation-in-part application of U.S. patent application Ser. No. 11/755,894, filed on May 31, 2007 now U.S. Pat. No. 7,991,172. This application also claims priority to Taiwan Patent Application No. 097221700, filed on Dec. 4, 2008.

BACKGROUND OF THE INVENTION

1. Field of Invention

The present invention relates to a multi-voltage headphone driver circuit, which provides more flexibility by way of providing multiple voltages.

2. Description of Related Art

FIG. 1 shows a typical structure of a conventional two-channel headphone driver circuit. In order to obtain a maximum dynamic range, the output of such conventional headphone is biased at a nominal DC voltage, which typically is half of a supplied voltage VDD (VDD/2). However, the DC bias causes significant amount of current to flow into the headphone speaker 16 and 18; this may, in addition to unnecessary power consumption, cause the headphone and the headphone driver to be damaged. Hence, the circuit requires capacitors Cdec to isolate the DC bias, and the capacitance of the capacitor Cdec is considerably large (in the range of several hundred μF).

The output waveform of this conventional headphone is shown in FIG. 2, in which the peak amplitude is VDD, the valley is 0, and the average is VDD/2.

In view of the problems caused by the DC bias, an improvement as shown in FIG. 3 is proposed, in which the low operation level of the two operational amplifiers is set to −VDD, so that the DC bias of the output voltage becomes 0. This eliminates the requirement of the large capacitors, but the circuit requires two operation voltages VDD and −VDD, and it is undesired to provide an additional I/O port for an external input of −VDD. Thus, this prior art proposes a charge pump 10, which converts the supplied voltage VDD to −VDD, so that the circuit only requires one voltage supply. The output waveform of this conventional headphone is shown in FIG. 4, in which the peak amplitude is VDD, the valley is −VDD, and the average is 0.

The second headphone driver circuit described above has the drawbacks that, the amplitude becomes double, so that the devices need to sustain higher voltage; and the power consumption also becomes double.

There are pros and cons in both foregoing prior art, but they have one common drawback: lack of flexibility, that is, they can not adaptively meet various different requirements. Thus, it is desired to provide a headphone driver circuit having higher flexibility than both prior art; the headphone driver circuit does not require devices with a higher voltage rating, or does not require large capacitors, or does not require both.

SUMMARY OF THE INVENTION

In view of the foregoing, it is an objective of the present invention to provide an improved circuit to overcome the drawbacks in the prior art.

In accordance with the foregoing objective of the present invention, the present invention discloses a multi-voltage headphone driver circuit comprising: at least one operational amplifier having an output supplied to a headphone speaker, the operational amplifier receiving a first power supply as its high operation voltage; a charge pump receiving a second power supply to generate a negative voltage corresponding to the second power supply in magnitude; and an m-fold circuit multiplying the negative voltage by m and providing the result to the operational amplifier as a low operation voltage thereof, wherein m is a real number.

In the case where $0 < m \leq 1$, the m-fold circuit can be a voltage drop charge pump.

The objectives, technical details, features, and effects of the present invention will be better understood with regard to the detailed description of the embodiments below, with reference to the drawings.

DESCRIPTION OF THE PREFERRED EMBODIMENTS

Figure 5:
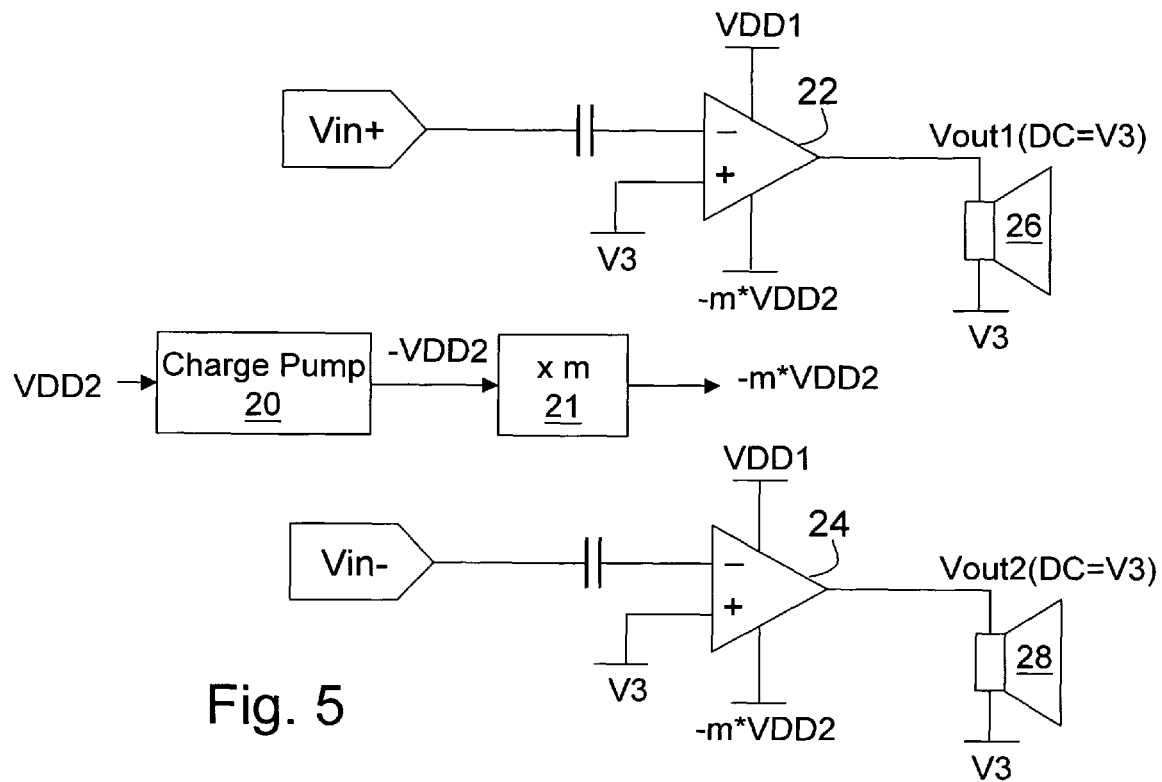
FIG. 5 is schematic diagram showing a preferred embodiment of a two-channel headphone driver circuit of the present invention.
Figure 6:
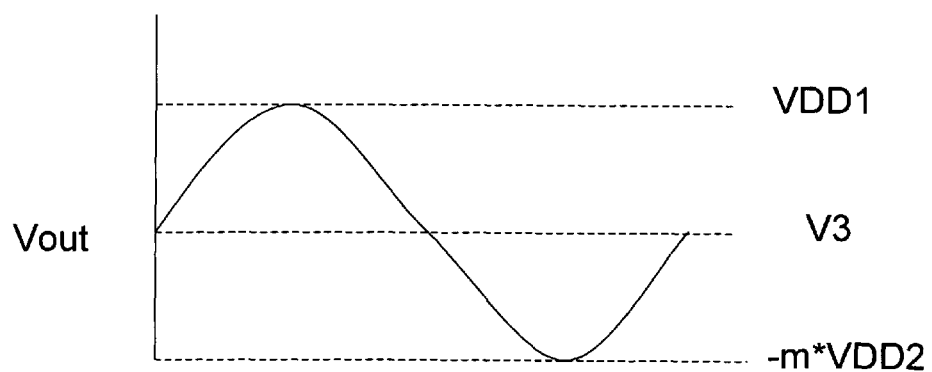
FIG. 6 is a corresponding waveform according to the circuit of FIG. 5.

Referring to FIG. 5, the difference of the present invention from the prior art is that it employs two voltage supplies VDD1 and VDD2 wherein the first voltage supply VDD1 is used to provide a high operation voltage for the two operational amplifiers 22 and 24, and the second voltage supply VDD2 is used to generate a low operation voltage −m*VDD2 which is also supplied to the two operational amplifiers 22 and 24, wherein m can be any real number, not limited to positive integers. By adjusting m, the low operation voltage can be adjusted to any voltage level. The waveform of the output voltage is shown in FIG. 6, wherein the peak is VDD1, the valley is −m*VDD2, and the average is [(VDD1−m*VDD2)/2], expressed by V3 (i.e. V3=(VDD1−m*VDD2)/2).

In one simplest application, m can be adjusted according to the relative relationship between the first voltage supply VDD1 and the second voltage supply VDD2, such that V3=−VDD1. In another simplest application, m may be set to 0 such that V3=0. In the latter condition, it may be required to provide capacitors between the operational amplifiers 22 and 24 and the speakers 26 and 28, respectively.

Figure 1:
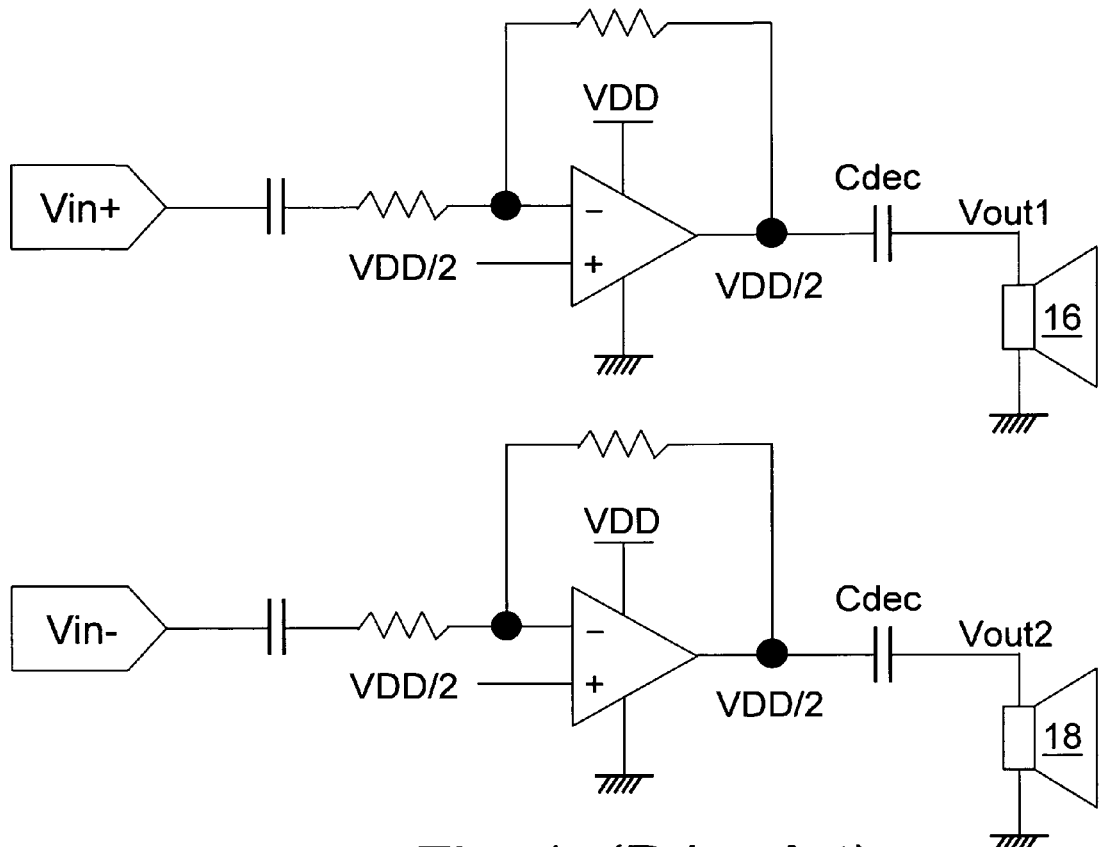
FIG. 1 is a schematic diagram showing a typical structure of a conventional two-channel headphone driver circuit.
Figure 2:
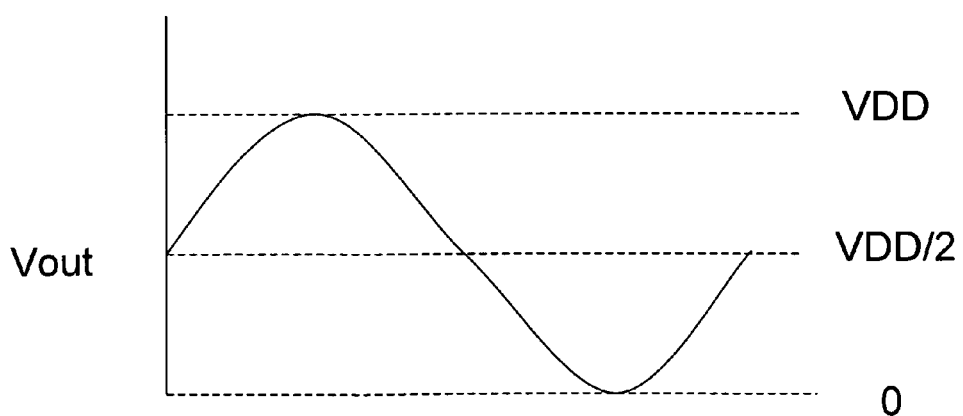
FIG. 2 is a corresponding waveform according to the circuit of FIG. 1.
Figure 3:
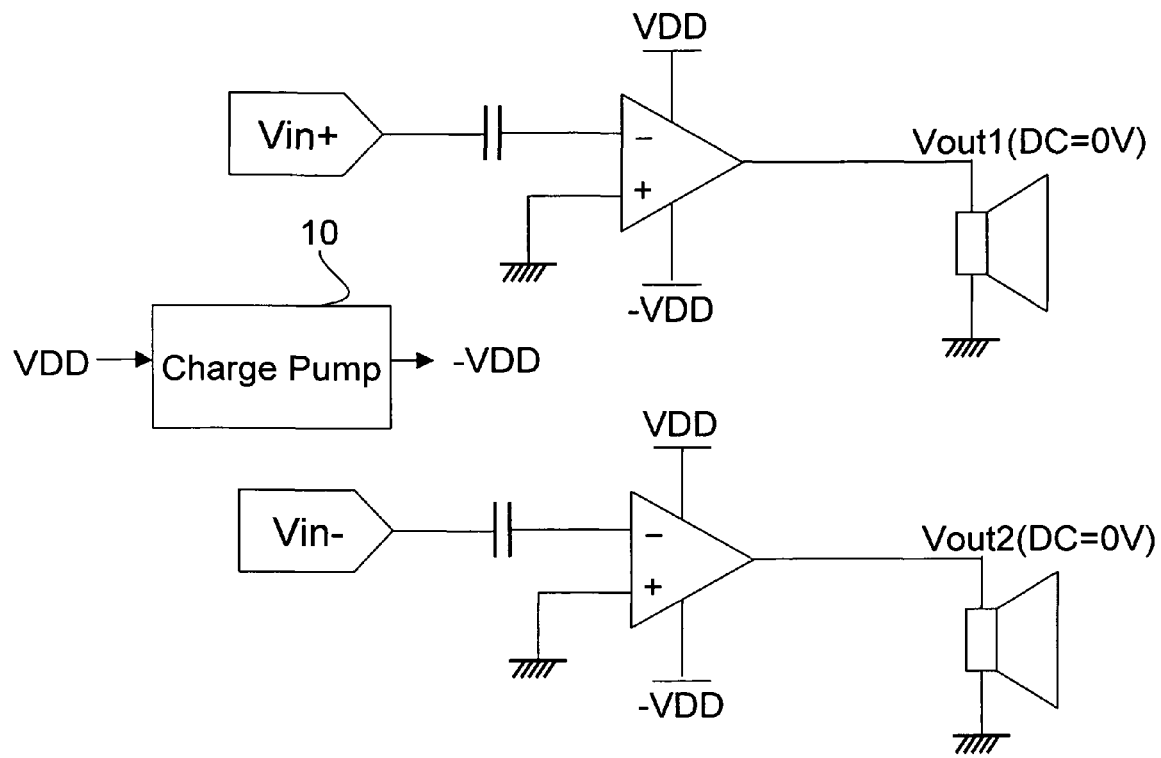
FIG. 3 is schematic diagram showing another conventional two-channel headphone driver circuit.
Figure 4:
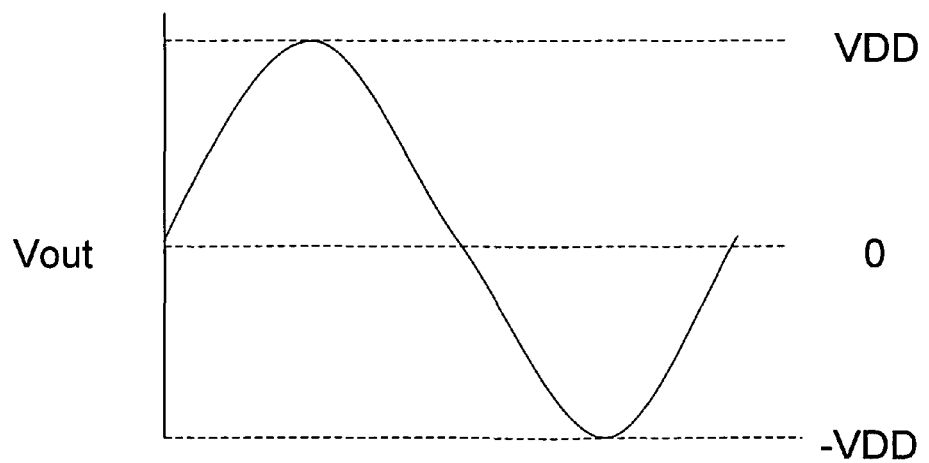
FIG. 4 is a corresponding waveform according to the circuit of FIG. 3.

In addition to the above, V3 may be set to any value other than 0 and −VDD1 as well. For example, given V3=−VDD1/2, the entire power consumption due to the amplitude of the output voltage can be made smaller than the circuit of FIG. 3. In this case, even if it is required to provide capacitors between the operational amplifiers 22 and 24 and the speakers 26 and 28, the required capacitance of the capacitors is still smaller than the circuit of FIG. 1. In other words, m can be adjusted such that a best balance is reached between the specifications of the capacitor and the device voltage rating.

In the embodiment of the present invention, the low operation voltage −m*VDD2 is generated as follows. A charge pump 20 converts the second voltage supply VDD2 to a negative voltage −VDD2; an m-fold circuit 21 receives this voltage −VDD2 and generates the voltage −m*VDD2. The m-fold circuit 21 can be embodied in various forms; in the case where m>1, the m-fold voltage can be generated by a charge pump which provides a voltage by charges accumulated on several capacitors.

Figure 7:
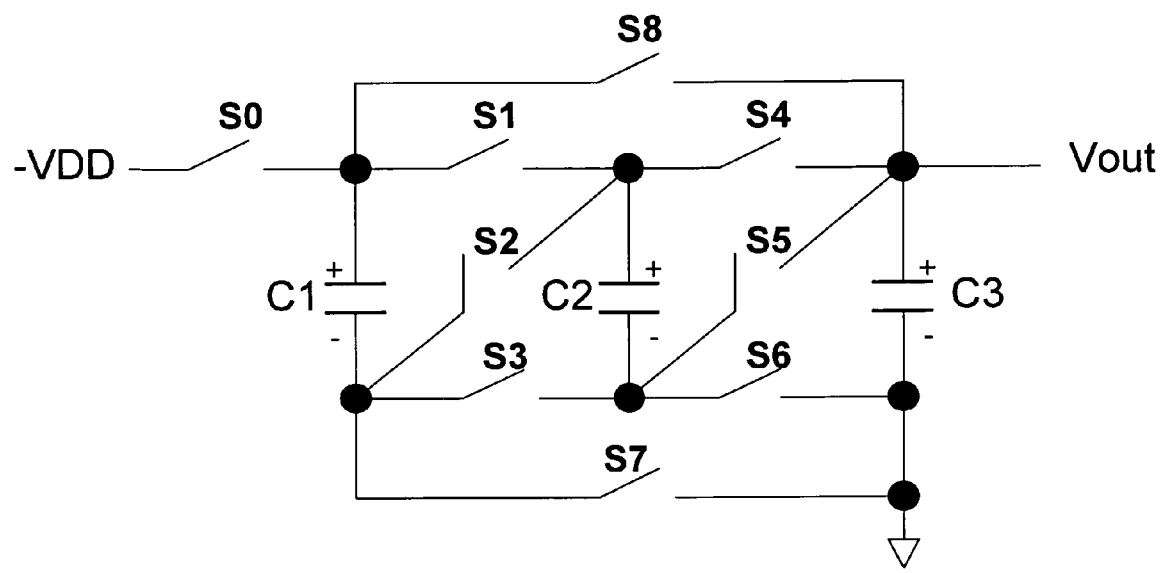
FIG. 7 shows a schematic circuit diagram, as an example of the m-fold circuit 21 according to the present invention.

In the case where 0<m≦1, the m-fold circuit 21 can be embodied in many forms as well, as referring to FIG. 7 for one example. It should be noted that one skilled in this art can readily conceive other forms of the m-fold circuit 21 under the teaching by the present invention, which should fall in the scope of the present invention.

As shown in FIG. 7, the m-fold circuit 21 in this embodiment is a voltage drop charge pump comprising three capacitors C1-C3 and nine switches S0-S8. The circuit can produce an output voltage Vout of 1X, (½)X, (⅓)X, (¼)X, (⅔)X, etc. of an input voltage −VDD, in the following ways:

Vout=−VDD (requiring only one time phase)
Switches S0, S1, and S4 are on while others are off.
Vout=−(½)VDD (requiring two time phases)
First time phase: switches S0, S1, S3 and S5 are on while others are off;
Second time phase: switches S1, S3, S4 and S6 are on while others are off.
Vout=−(⅓)VDD (requiring two time phases)
First time phase: switches S0, S2 and S5 are on, while others are off;
Second time period: switches S1, S3, S4 and S6 are on, while others are off.
Vout=−(¼)VDD (requiring three time phases)
First time phase: switches S0, S2 and S5 are on, while others are off;
Second time phase: switches S4 and S6 are on, while others are off;
Third time phase: switches S1, S5, and S7 are on, while others are off.
Vout=−(⅔) VDD (required two time phases)
First time period: switches S0, S1, S3 and S5 are on, while others are off;
Second time period: switches S2, S6 and S8 are on, while others are off.

The foregoing m-fold circuit 21 can generate various m-fold voltages, such that the headphone driver circuit of the present invention is more flexible to meet various different requirements.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the application of the present invention is not limited to the two-channel headphone only; the charge pump 20 and the m-fold circuit 21 can be embodied in various forms, not limited to the examples enumerated. In view of the foregoing, the spirit of the present invention should cover all such and other modifications and variations, which should be interpreted to fall within the scope of the following claims and their equivalents.

What is claimed is:

1. A multi-voltage headphone driver circuit comprising:
at least one operational amplifier having an output supplied to a headphone speaker, the operational amplifier receiving a first power supply as its high operation voltage;
a charge pump receiving a second power supply to generate a negative voltage corresponding to the second power supply in magnitude; and
an m-fold circuit multiplying the negative voltage by m and providing the result to the operational amplifier as a low operation voltage thereof, wherein m is a real number;
wherein the headphone speaker has one terminal coupled to an output of the operational amplifier and another terminal coupled to a voltage level which is an average of the high operation voltage and the low operation voltage.

2. The multi-voltage headphone driver circuit of claim 1, wherein the m-fold circuit is a voltage drop charge pump.

3. The multi-level voltage headphone driver circuit of claim 1 comprising two operational amplifiers having outputs supplied to two headphone speakers respectively.

* * * * *